United States Patent [19]

Inoue

[11] Patent Number: 5,229,711
[45] Date of Patent: Jul. 20, 1993

[54] REFERENCE VOLTAGE GENERATING CIRCUIT

[75] Inventor: Norio Inoue, Yamatokoriyama, Japan

[73] Assignee: Sharp Kabushiki Kaisha, Osaka, Japan

[21] Appl. No.: 858,530

[22] Filed: Mar. 27, 1992

[30] Foreign Application Priority Data

Aug. 30, 1991 [JP] Japan .................................. 3-220628

[51] Int. Cl.$^5$ ............................................... G05F 3/20
[52] U.S. Cl. ..................................................... 323/313
[58] Field of Search ............... 323/313, 312, 311, 281; 307/296.1, 296.6

[56] References Cited

U.S. PATENT DOCUMENTS

| | | | |
|---|---|---|---|
| 3,887,863 | 6/1975 | Brokaw | 323/313 |
| 4,087,758 | 5/1978 | Hareyama | 323/313 |
| 4,249,122 | 2/1981 | Widlar | 323/313 |
| 4,317,054 | 2/1982 | Caruso et al. | 323/313 |
| 4,327,320 | 4/1982 | Oguey | 323/313 |
| 5,119,015 | 6/1992 | Watanabe | 323/313 |

FOREIGN PATENT DOCUMENTS

| | | | |
|---|---|---|---|
| 61-21857 | 7/1974 | Japan . | |
| 0019546 | 2/1978 | Japan | 323/313 |
| 0189421 | 10/1984 | Japan | 323/313 |
| 2054219 | 2/1991 | United Kingdom | 323/313 |

*Primary Examiner*—Steven L. Stephan
*Assistant Examiner*—Adolf Berhane
*Attorney, Agent, or Firm*—Nixon & Vanderhye

[57] ABSTRACT

A reference voltage generating circuit is provided which includes a first voltage producing circuit having a first transistor, a first resistor, and a second resistor for producing a first voltage based on the base-emitter voltage of the first transistor and the resistance values of the first and second resistors; a second voltage producing circuit having a second transistor, a third resistor, and a fourth resistor for producing a second voltage, which is different from the first voltage, based on the base-emitter voltage of the second transistor and the resistance values of the third and fourth resistors; and an amplifying circuit to which the first voltage is input from the first voltage producing circuit and the second voltage is input from the second voltage producing circuit and which amplifies the difference between the two voltages to generate a reference voltage.

10 Claims, 3 Drawing Sheets

REFERENCE VOLTAGE GENERATING CIRCUIT

BACKGROUND OF THE INVENTION

1. Field of the Invention

The present invention relates to a reference voltage generating circuit used for various LSI circuits and the like.

2. Description of the Prior Art

FIG. 3 shows an equivalent circuit 100 of a prior art reference voltage generating circuit formed on a semiconductor substrate. The construction of this circuit is such that two diodes Q3 and Q4, each constructed from a transistor with its base and collector shorted, are respectively provided with emitters of different area sizes, thereby generating a band-gap voltage $\Delta V_{BE}$ which is then amplified by a DC amplifier OP2, an operational amplifier, to generate a reference voltage $V_{ref}$. In FIG. 3, R7 and R8 indicate resistors.

In the above equivant reference voltage generating circuit 100, when the emitter area of the diode Q3 is denoted as $A_1$ (not shown) and the emitter area of the diode Q4 as $A_2$ (not shown), the band-gap voltage $\Delta V_{BE}$ can be expressed by Equation 1 given below. The circuit 100 is so configured that the current $I_f$ that flows from the output to the inverting input of the DC amplifier OP2 through the resistor R7 satisfies the relationship $I_o > I_f$ with respect to the input current $I_o$.

$$\Delta V_{BE} = V_T \ln \frac{I_o/A_1}{I_o/A_2} = V_T \ln \frac{A_2}{A_1} \quad \text{[EQU. 1]}$$

$$\text{where } V_T = \frac{kT}{g} \approx 26 \text{ mV } (T = 300 \text{ K})$$

k = Boltzmann's constant
T = Absolute temperature
g = Amount of electron charge

The reference voltage $V_{ref}$ output from the DC amplifier OP2 is expressed by the following Equation 2:

$$V_{ref} = V_{BE3} + \frac{Re}{Rf} \cdot \Delta V_{BE} \quad \text{[EQU. 2]}$$

where $V_{BE3}$ is the value of the voltage applied from the diode Q3 to the non-inverting input of the DC amplifier OP2, Re and Rf are the resistance values of the resistors R7 and R8, and Re/Rf represents the gain of the DC amplifier OP2.

As can be seen from Equation 2, the reference voltage $V_{ref}$ is generated by using the band-gap voltage $\Delta V_{BE}$.

There are, however, drawbacks associated with the above type of prior art reference voltage circuit. In the above prior art reference voltage circuit, if, for example, 3.3 V is to be obtained as the reference voltage $V_{ref}$, assuming that the emitter area ratio $A_2/A_1$ is 10/1, the band-gap voltage $\Delta V_{BE}$ will be approximately 60 mV from Equation 1. Re/Rf, expressed by the following Equation 3 obtained by transforming Equation 2, will be 44. This means that the DC amplifier OP2 will be required to have a gain Re/Rf of 44.

$$\frac{Re}{Rf} = \frac{V_{ref} - V_{BE3}}{\Delta V_{BE}} = \frac{V_{ref} - V_{BE3}}{V_T \ln(A_2/A_1)} \quad \text{[EQU. 3]}$$

In this situation, if it is assumed that 10 mV is generated as an offset voltage $V_{offset}$ for the DC amplifier OP2, for example, an error voltage $\Delta V_{ref}$ (expressed by the following Equation 4) of 0.44 V will occur to the reference voltage $V_{ref}$ due to the offset voltage $V_{offset}$.

$$\Delta V_{ref} = V_{offset} \times \frac{Re}{Rf} = V_{offset} \cdot \frac{V_{ref} - V_{BE3}}{V_T \ln(A_2/A_1)} \quad \text{[EQU. 4]}$$

If the gain Re/Rf of the DC amplifier OP2 is to be reduced in order to reduce the error voltage $\Delta V_{ref}$, one common approach would be to increase the band-gap voltage $\Delta V_{BE}$ by increasing the emitter area ratio $A_2/A_1$.

However, even if the emitter area ratio $A_2/A_1$ is increased ten-fold to 100, the band-gap voltage $\Delta V_{BE}$ can only be increased by a factor of two to 120 mV, which means that the gain Re/Rf of the DC amplifier OP2 can only be reduced by half to 22. Furthermore, the increase in the emitter area ratio $A_2/A_1$ will lead to an increase in errors in terms of electrical characteristics as will appreciated by those having ordinary skill in the art.

The present invention aims to overcome the above problems in the prior art, and an object of the invention is to provide a reference voltage generating circuit wherein, when generating the reference voltage, the amplifying gain is reduced, thereby reducing the susceptibility to the effect of the offset voltage.

SUMMARY OF THE INVENTION

The reference voltage generating circuit of the present invention overcomes the above-discussed and numerous other disadvantages and deficiencies of the prior art. The present invention is summarized and is described in detail below.

According to one aspect of the present invention, a reference voltage generating circuit is provided which includes a first voltage producing means having a first transistor, a first resistor, and a second resistor for producing a first voltage based on the base-emitter voltage of the first transistor and the resistance values of the first and second resistors; a second voltage producing means having a second transistor, a third resistor, and a fourth resistor for producing a second voltage, which is different from the first voltage, based on the base-emitter voltage of the second transistor and the resistance values of the third and fourth resistors; and an amplifying means to which the first voltage is input from the first voltage producing means and the second voltage is input from the second voltage producing means and which amplifies the difference between the two voltages to generate a reference voltage.

Accordingly, the first voltage producing means produces the first voltage based on the base-emitter voltage of the first transistor and the resistance values of the first and second resistors. On the other hand, the second voltage producing means produces the second voltage, which is different from the first voltage, based on the base-emitter voltage of the second transistor and the resistance values of the third and fourth resistors.

As a result, the first voltage can be varied by varying the resistance values of the two resistors in the first voltage producing means, while the second voltage can be varied by varying the resistance values of the two resistors in the second voltage producing means. This means that the difference between the first and second voltages can be increased by adjusting the resistance values of the respective voltage producing means, thus making it possible to obtain the desired reference voltage even when the gain of the amplifying means is made smaller. Furthermore, since the gain of the amplifying means is small, susceptibility to the effect of the offset voltage is reduced.

Thus, the invention described herein makes possible the objective of providing a reference voltage generating wherein, when generating the reference voltage, the amplifying gain can be reduced, thereby reducing the susceptibility of the reference voltage generating circuit to the effect of offset voltages.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
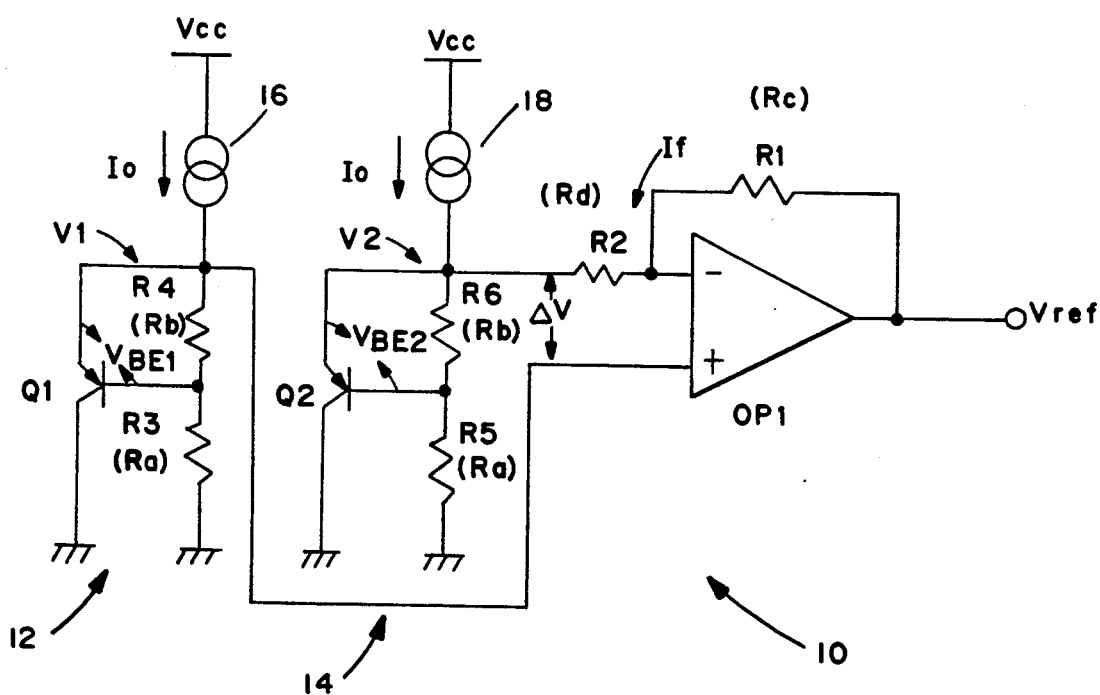
FIG. 1 is an equivalent circuit of a reference voltage generating according to one embodiment of the present invention.

A preferred embodiment of the present invention will now be described with reference to the drawings, wherein like reference numerals are used to refer to like elements throughout.

FIG. 1 shows an equivalent circuit 10 of a reference voltage generating means according to the preferred embodiment. The circuit 10 is formed on a semiconductor substrate using known fabrication techniques. The equivalent reference voltage generating circuit 10 includes a first voltage producing circuit 12 having a pnp transistor Q1, a resistor R3, and a resistor R4. In addition, the equivalent circuit 10 includes a second voltage producing circuit 14 having a pnp transistor Q2, a resistor R5, and a resistor R6. A DC amplifier OP1 is included in the equivalent circuit 10 for amplifying a differential voltage $\Delta V$, which represents the difference between a first voltage V1 produced by the first voltage producing circuit 12 and a second voltage V2 produced by the second voltage producing circuit 14. The DC amplifier OP1, in turn, generates a reference voltage $V_{ref}$ at its output. In the FIG. 1, Vcc indicates the supply voltage.

Describing now the equivalent circuit 10 in more detail, the resistors R3 and R4 in the first voltage producing circuit 12 are connected in series with a constant current source 16 of magnitude $I_o$. One terminal of the constant current source 16 is connected to the supply voltage Vcc and the other terminal is connected to resistor R4. The remaining terminal of resistor R4 is connected to resistor R3 whose other terminal is connected to ground. The emitter of transistor Q1 is connected to the node between the constant current source 16 and resistor R4, the base of the transistor Q1 is connected to the node between resistors R3 and R4, and the transistor Q1 collector is connected to ground. The voltage V1 formed at the node located between the constant current source 16 and the resistor R4 is coupled to the non-inverting input of the DC amplifier OP1 as is shown. The base to emitter voltage of transistor Q1 is represented by $V_{BE1}$.

Similarly, the second voltage producing circuit 14 includes resistors R5 and R6 connected in series with a constant current source 18 also having a magnitude $I_o$. One terminal of the constant current source 18 is connected to the supply voltage Vcc and the other terminal is connected to a terminal of resistor R6. The other terminal of resistor R6 is connected to resistor R5, whose remaining terminal is connected to ground.

The base of transistor Q2 is coupled to the node between resistors R5 and R6. The emitter of Q2 is connected to the node between resistor R6 and the constant current source 18. The collector of transistor Q2 is coupled to ground. The voltage V2 formed at the node between the constant current source 18 and resistor R6 is connected to the inverting input of the DC amplifier by way of a resistor R2. Feedback resistor R1 is coupled form the output of the DC amplifier OP1 to the inverting input as is shown. The base to emitter voltage of transistor Q2 is represented by $V_{BE2}$.

Thus, the first voltage producing circuit 12 comprises the pnp transistor Q1 and the two resistors R3 and R4 and produces a first voltage V1 based on the base-emitter voltage $V_{BE1}$ of the pnp transistor Q1 and the respective resistance values Ra and Rb of the two resistors R3 and R4. On the other hand, the second voltage producing circuit comprises the pnp transistor Q2 and the two resistors R5 and R6 and produces a second voltage V2, which is different from the first voltage V1, based on the base-emitter voltage $V_{BE2}$ of the pnp transistor Q2 and the respective resistance values Ra and Rb of the two resistors R5 and R6.

As a result, the first voltage V1 can be varied by varying the resistance values Ra and Rb of the two resistors R3 and R4 in the first voltage producing circuit 12, while the second voltage V2 can be varied by varying the resistance values Ra and Rb of the two resistors R5 and R6 in the second voltage producing circuit 14. This means that the differential voltage $\Delta V$, which represents the difference between the first voltage V1 and the second voltage V2, can be increased according to one embodiment by adjusting the resistance values in the respective voltage producing circuits, thus making it possible to obtain the desired reference voltage $V_{ref}$ even when the gain of a DC amplifier OP1 is made smaller. Furthermore, since the gain of the DC amplifier OP1 is small, susceptibility to the effect of offset voltage is reduced.

Figure 2A:
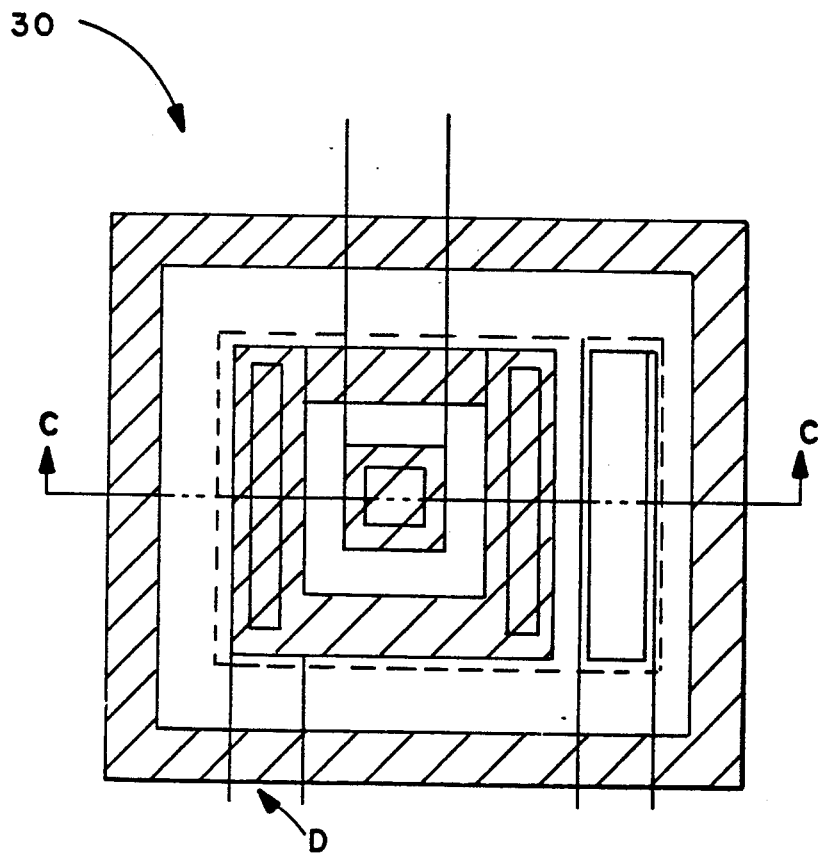
FIGS. 2A and 2B are diagrams illustrating the emitter area of a transistor in accordance with the present invention, FIG. 2A being a plan view and FIG. 2B being a cross sectional view taken along line C—C shown in FIG. 2A.
Figure 2B:
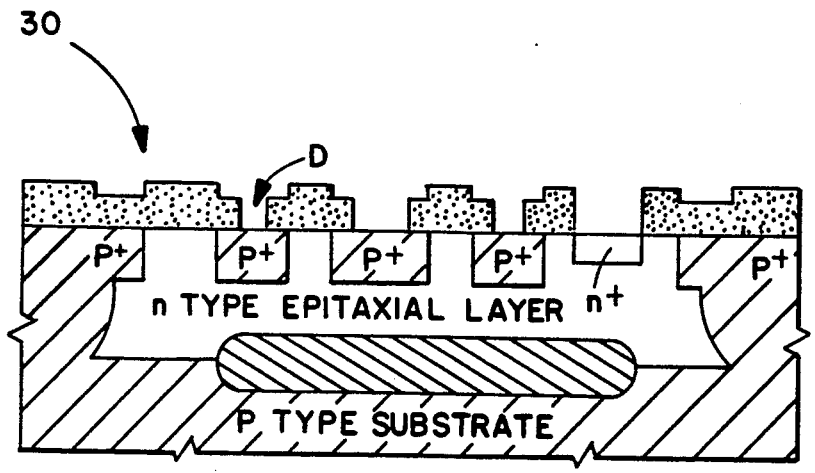
Figure 3:
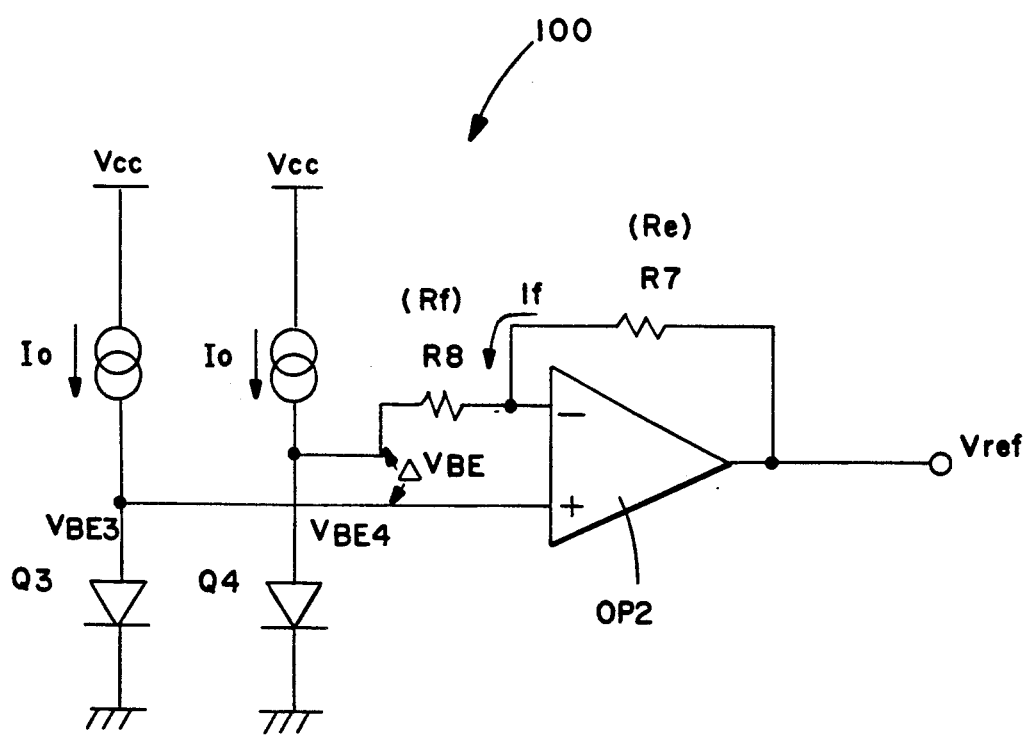
FIG. 3 is an equivalent circuit of a prior art reference voltage generating circuit.

In the preferred embodiment, the emitter areas of the pnp transistors Q1 and Q2 are made different from each other. The resistor R3 in the first voltage producing circuit 12 and the resistor R5 in the second voltage producing circuit 14 have an equal resistance value Ra, and likewise, the resistors R4 and R6 have an equal resistance value Rb. The DC amplifier OP1 has a gain expressed as a ratio of Rc/Rd which is the ratio of the resistance value Rc of the resistor R1 to the resistance value Rd of the resistor R2. To explain the above-mentioned emitter area, reference is made to an exemplary lateral pnp transistor 30 shown in FIGS. 2A and 2B, wherein FIG. 2A shows a plan view and FIG. 2B shows a cross sectional view along line C—C. The emitter area refers to the area, as viewed from the top of the emitter indicated by the reference sign D in FIGS. 2A and 2B. The same applies to the emitter area mentioned in the foregoing description of the prior art.

When the emitter areas of the pnp transistors Q1 and Q2 formed on the substrate are respectively denoted as $A_1$ and $A_2$, and the base-emitter voltages $V_{BE}$ of the pnp transistors Q1 and Q2 as $V_{BE1}$ and $V_{BE2}$, the first voltage V1, the second voltage V2, and the differential voltage $\Delta V$ in circuit 10 can be expressed by the following Equations 5, 6, and 7, respectively.

$$V_1 = V_{BE1}\left(1 + \frac{Ra}{Rb}\right) \quad [\text{EQU. 5}]$$

$$V_2 = V_{BE2}\left(1 + \frac{Ra}{Rb}\right) \quad [\text{EQU. 6}]$$

$$\Delta V = \Delta V_{BE}\left(1 + \frac{Ra}{Rb}\right) = V_T \ln\frac{A_2}{A_1}\left(1 + \frac{Ra}{Rb}\right) \quad [\text{EQU. 7}]$$

where $\Delta V_{BE}$ is a band-gap voltage which represents the difference between $V_{BE1}$ and $V_{BE2}$. Also, it is assumed that the feedback current $I_f$ (FIG. 1) that affects the second voltage V2 satisfies the relationship $I_o > I_f$ with respect to the input current $I_o$.

Therefore, as can be seen from Equation 7, $\Delta V$ represents the value obtained by amplifying the band-gap voltage $\Delta V_{BE}$ by unity plus the resistance ratio Ra/Rb.

Further, the reference voltage $V_{ref}$ produced by the DC amplifier OP1 that amplifies the differential voltage $\Delta V$ can be expressed by the following Equation 8.

$$V_{ref} = \left(1 + \frac{Ra}{Rb}\right)\left(\Delta V_{BE} \cdot \frac{Rc}{Rd} + V_{BE1}\right) \quad [\text{EQU. 8}]$$

From the above Equation 8, the gain Rc/Rd of the DC amplifier OP1 is given as the following Equation 9.

$$\frac{Rc}{Rd} = \frac{V_{ref}/(1 + Ra/Rb) - V_{BE1}}{\Delta V_{BE}} \quad [\text{EQU. 9}]$$

$$= \frac{V_{ref}/(1 + Ra/Rb) - V_{BE1}}{V_T \ln(A_2/A_1)}$$

As can be seen from Equation 8, according to the reference voltage generating circuit 10 of the invention, the desired reference voltage $V_{ref}$ can be obtained by increasing the resistance ratio Ra/Rb in both the first and second voltage producing circuits 12 and 14. Therefore, even with the same emitter area ratio $A_2/A_1$ as used in the prior art, the gain of the DC amplifier OP1 can be made smaller. This makes it possible to reduce the effect of the offset voltage against the reference voltage $V_{ref}$ to be output from the DC amplifier OP1 and thereby the error voltage caused by the offset voltage as discussed above.

In the above embodiment, the resistance values of the two resistors R3 and R4 in the first voltage producing circuit 12 and the two resistors R5 and R6 in the second voltage producing circuit 14 are made equal, respectively, but it will be appreciated that the present invention is not limited to such arrangement, and the resistance values may be made different in another embodiment.

Also, in the above embodiment, pnp transistors are used, but it will be appreciated that the present invention is not limited to the use of this type of transistor. Alternatively, npn transistors or other type transistors may be used without departing from the present invention.

As is apparent from the above detailed description, the present invention provides the excellent advantage that the gain of amplifying means such as a DC amplifier can be made smaller thereby reducing the effect of the offset voltage that the amplifying means suffers.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A reference voltage generating circuit comprising:
   first voltage producing means having a first transistor, a first resistor, and a second resistor, for producing a first voltage based on a base-emitter voltage of the first transistor and the resistance values of the first and second resistors;
   second voltage producing means having a second transistor, a third resistor, and a fourth resistor, for producing a second voltage, which is different from the first voltage, based on a base-emitter voltage of the second transistor and the resistance values of the third and fourth resistors; and
   amplifying means, comprising an operational amplifier, a fifth resistor and a sixth resistor, for receiving the first voltage from the first voltage producing means and the second voltage from the second voltage producing means, for amplifying a difference voltage between the two voltages and for generating a reference voltage, the operational amplifier amplifying the difference voltage by a gain based on a ratio based by the resistance vales of the fifth and sixth resistors.

2. The circuit of claim 1, wherein a ratio of said resistance values of said first and second resistors is different from a ratio of said resistance values of said third and fourth resistors.

3. The circuit of claim 1, wherein emitter areas of said first and second transistors are different.

4. The circuit of claim 3, wherein a ratio of said resistance values of said first and second resistors is substantially equal to a ratio of said resistance value of said third and fourth resistors.

5. The circuit of claim 1, wherein said first and second transistors are pnp transistors.

6. The circuit of claim 1, wherein said first and second transistors are npn transistors.

7. The circuit of claim 1, wherein said amplifying means comprises a operational amplifier.

8. A reference voltage generating circuit according to claim 1, the first voltage producing means comprising a series circuit formed with the first and the second resistors, wherein one end of the series circuit is connected to a first electrode of the first transistor and the node of the series circuit is connected to a second electrode of the first transistor.

9. A reference voltage generating circuit according to claim 8, the second voltage producing means comprising a series circuit formed with the third and the fourth resistors, wherein one end of the series circuit is connected to a first electrode of the second transistor and the node of the series circuit is connected to a second electrode of the second transistor.

10. A reference voltage generating circuit according to claim 1, wherein a first end of the fifth resistor is connected to one of the first and second voltage producing means, a second end of the fifth resistor is connected to one of the inputs of the operational amplifier and to a first end of the sixth resistor, and a second end of the sixth resistor is connected to an output of the operational amplifier.

* * * * *